United States Patent

Campbell et al.

(10) Patent No.: US 9,581,654 B2
(45) Date of Patent: Feb. 28, 2017

(54) VEHICLE BATTERY MONITORING SYSTEM

(71) Applicant: Johnson Controls Technology Company, Holland, MI (US)

(72) Inventors: Douglas C. Campbell, Northville, MI (US); Thomas H. Morell, Spring Lake, MI (US)

(73) Assignee: Johnson Controls Technology Company, Holland, MI (US)

( * ) Notice: Subject to any disclaimer, the term of this patent is extended or adjusted under 35 U.S.C. 154(b) by 593 days.

(21) Appl. No.: 14/084,100

(22) Filed: Nov. 19, 2013

(65) Prior Publication Data

US 2014/0225428 A1    Aug. 14, 2014

Related U.S. Application Data

(60) Provisional application No. 61/763,768, filed on Feb. 12, 2013.

(51) Int. Cl.
| | |
|---|---|
| *H02J 7/00* | (2006.01) |
| *H02J 9/00* | (2006.01) |
| *G01R 31/36* | (2006.01) |
| *H01M 10/42* | (2006.01) |
| *H01M 10/48* | (2006.01) |

(Continued)

(52) U.S. Cl.
CPC ...... *G01R 31/3679* (2013.01); *B60L 11/1857* (2013.01); *B60L 11/1861* (2013.01); *H01M 10/425* (2013.01); *H01M 10/48* (2013.01); *B60L 2240/545* (2013.01); *B60L 2240/547* (2013.01); *B60L 2250/16* (2013.01); *G01R 31/3682* (2013.01); *G01R 35/00* (2013.01); *H01M 2010/4271* (2013.01); *H01M 2010/4278* (2013.01); *H01M 2220/20* (2013.01); *Y02T 10/7005* (2013.01); *Y02T 10/705* (2013.01); *Y02T 10/7044* (2013.01)

(58) Field of Classification Search
CPC ........................ G01R 31/3679; B60L 11/1861
USPC .......................................... 307/150; 320/132
See application file for complete search history.

(56) References Cited

U.S. PATENT DOCUMENTS

| | | |
|---|---|---|
| 6,094,031 A | 7/2000 | Shimane et al. |
| 8,822,508 B2 | 9/2014 | Quesnel et al. |

(Continued)

FOREIGN PATENT DOCUMENTS

| | | |
|---|---|---|
| CN | 1313831 | 5/2007 |
| DE | 10-2009-046564 A1 | 5/2011 |

(Continued)

OTHER PUBLICATIONS

International Search Report and Written Opinion for PCT Application No. PCT/US2014/012570 dated Apr. 8, 2014; 9 pgs.
CN 201480020758.X First Office Action dated Nov. 2, 2016.

*Primary Examiner* — Carlos Amaya
(74) *Attorney, Agent, or Firm* — Fletcher Yoder P.C.

(57) ABSTRACT

A battery includes a battery monitoring system for performing a battery self test. The battery monitoring system is integrated into the battery and configured to monitor a first health of the battery. The battery monitoring system is configured to receive an input signal from a wired interface or a wireless interface. The input signal is configured to instruct the battery monitoring system to provide feedback regarding the first health of the battery and/or a second health of the battery monitoring system. The wired interface consists of a positive terminal and a negative terminal of the battery.

20 Claims, 4 Drawing Sheets

(51) Int. Cl.
 *B60L 11/18* (2006.01)
 *G01R 35/00* (2006.01)

(56) References Cited

U.S. PATENT DOCUMENTS

| | | |
|---|---|---|
| 9,333,874 B2 | 5/2016 | Kubo et al. |
| 2012/0282500 A1 | 11/2012 | Tzivanopoulos et al. |

FOREIGN PATENT DOCUMENTS

| | | |
|---|---|---|
| EP | 2336796 A1 | 6/2011 |
| WO | 2012162450 A1 | 11/2012 |

VEHICLE BATTERY MONITORING SYSTEM

CROSS REFERENCE TO RELATED APPLICATION

This application claims priority from and the benefit of U.S. Provisional Application Ser. No. 61/763,768, entitled "VEHICLE BATTERY MONITORING SYSTEM", filed Feb. 12, 2013, which is hereby incorporated by reference in its entirety.

BACKGROUND

The invention relates generally to batteries, and more particularly, to a vehicle battery monitoring system.

Motor vehicles generally include a battery configured to provide power for starting the vehicle, and to provide power for an electrical system of the vehicle. Over time, a health of the vehicle battery may change. For example, after a number of years, a vehicle battery may not be able to properly hold a charge. Certain batteries may include a battery monitoring system for monitoring the health of the battery. Accordingly, the battery monitoring system may monitor various parameters of the battery. For example, the battery monitoring system of the battery may be configured to measure one or more voltages of the battery.

Battery monitoring systems may only provide feedback regarding the health of the battery after the health has degraded. Other battery monitoring systems may consistently provide feedback regarding the health of the battery, but the feedback may only change when there is a change in the health of the battery (e.g., the health of the battery has deteriorated). With limited feedback from the battery monitoring system, a user may be concerned about whether the battery monitoring system is operating properly. Furthermore, in batteries where the battery monitoring system is integrated inside the battery, the user may not receive feedback regarding whether the battery monitoring system is operating properly.

BRIEF DESCRIPTION OF THE INVENTION

The present invention relates to a battery including a battery monitoring system integrated into the battery and configured to monitor a first health of the battery. The battery monitoring system is configured to receive an input signal from a wired interface or a wireless interface. The input signal is configured to instruct the battery monitoring system to provide feedback regarding the first health of the battery and/or a second health of the battery monitoring system. The wired interface consists of a positive terminal and a negative terminal of the battery.

The present invention also relates to a method for performing a self test of a battery. The method includes monitoring a battery voltage or current using a battery monitoring system disposed within the battery. The method also includes detecting a predetermined change in the monitored battery voltage or current. The predetermined change is detected by the battery monitoring system. The method includes providing feedback indicative of a first health of the battery and/or a second health of the battery monitoring system upon detecting the predetermined change.

The present invention further relates to a motor vehicle including a battery having an integrated battery monitoring system configured to monitor a first health of the battery. The battery monitoring system is configured to receive an input signal from a wired interface or a wireless interface. The input signal is configured to instruct the battery monitoring system to provide feedback regarding the first health of the battery and/or a second health of the battery monitoring system. The wired interface consists of a positive terminal and a negative terminal of the battery. The motor vehicle also includes an electrical system electrically coupled to the positive terminal and the negative terminal of the battery and configured to draw current from the battery.

DRAWINGS

DETAILED DESCRIPTION

Figure 1:
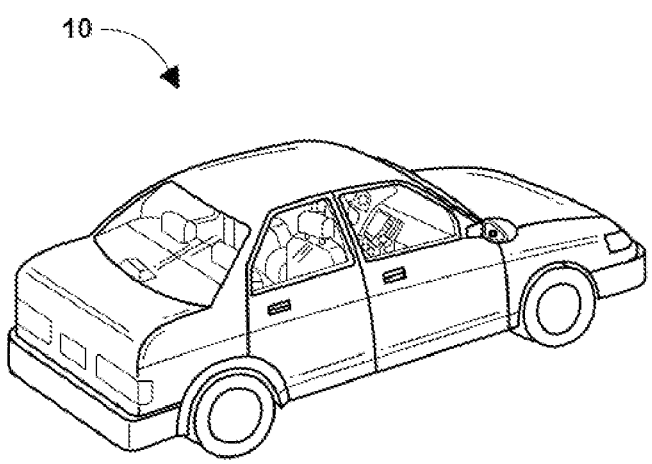
FIG. 1 is a perspective view of an exemplary vehicle that includes a battery which may employ a battery monitoring system configured to perform a battery self test.

FIG. 1 is a perspective view of an exemplary vehicle 10 that includes a battery which may employ a battery monitoring system configured to perform a battery self test. In certain embodiments, the vehicle 10 includes a battery configured to provide power for starting the vehicle 10, and to provide power for an electrical system of the vehicle 10. For example, the vehicle 10 may include a gas-powered engine and an electric starter motor configured to initiate operation of the engine (e.g., via a start/stop system). Alternatively, the vehicle 10 may include a hybrid propulsion system including a gas-powered engine and an electric motor. Monitoring various parameters of the battery may provide data regarding the health of the battery. For example, the voltage of the battery may be measured to provide an accurate determination of the state of charge, and/or to determine if the voltage drops below a predetermined value.

Certain embodiments described below include a battery monitoring system integrated within a battery. The integrated battery monitoring system may monitor the health of the battery using a sensor configured to monitor an operational parameter (e.g., voltage, temperature, etc.) of the battery. The battery monitoring system may output a signal indicative of the health of the battery. For example, the battery monitoring system may output a signal to an audio output device and/or a visual output device. As discussed in detail below, the battery monitoring system may be mounted to an interior surface of the battery such that the battery terminals (e.g., positive terminal, negative terminal) are the only accessible inputs to and/or outputs of the battery.

As will be appreciated, a user of the battery may want to determine whether the battery monitoring system is functioning properly. Accordingly, the battery monitoring system includes a self test that may be initiated by the user without switches or buttons disposed on the battery. For example, the self test may be initiated by changing a current or voltage drawn from the battery and/or by transmitting a wireless signal to the battery. After performing a self test, the battery monitoring system may be configured to provide feedback regarding the health of the battery, and/or the battery monitoring system. The battery monitoring system may also provide feedback regarding the health of the battery, and/or the battery monitoring system without performing a self test (e.g., by providing results from a previous test, or by providing results from a memory device). As such, the user of the battery may be able to determine that the battery and/or the battery monitoring system are functioning properly.

Figure 2:
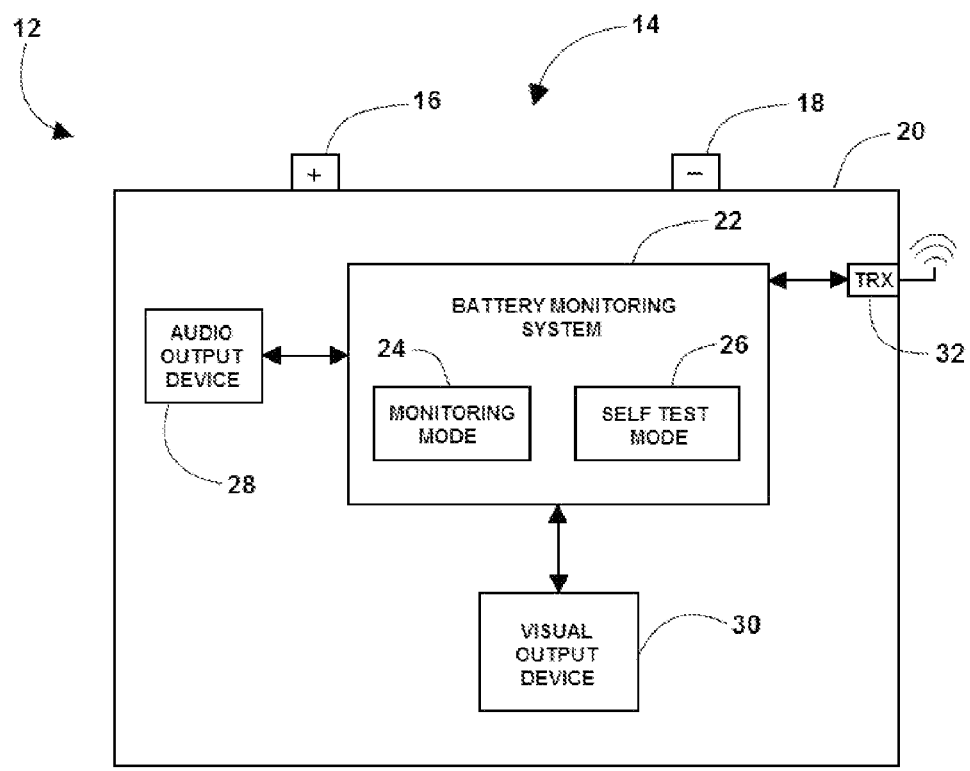
FIG. 2 is a block diagram of an embodiment of a battery which employs a battery monitoring system configured to perform a battery self test.

FIG. 2 is a block diagram of an embodiment of a battery 12 which employs a battery monitoring system configured to perform a battery self test. As illustrated, the battery 12 includes input devices 14 for accessing power of the battery 12, and for initiating the battery self test. The input devices 14 include a positive terminal 16 and a negative terminal 18. The positive terminal 16 and the negative terminal 18 extend out of a housing 20 of the battery 12. Furthermore, the positive terminal 16 and the negative terminal 18 are the only accessible input devices 14 of the battery 12 (e.g., the only input devices 14 located on the outside of the housing 20).

The battery 12 includes an integrated battery monitoring system 22 (e.g., the battery monitoring system 22 is within the housing 20 of the battery 12). The battery monitoring system 22 is configured to monitor the health of the battery 12 (e.g., by monitoring a voltage of the battery). Accordingly, the battery monitoring system 22 includes a monitoring mode 24 configured to monitor the health of the battery 12, and to provide feedback regarding the health of the battery 12. For example, in certain embodiments the monitoring mode 24 provides feedback regarding the health of the battery 12 when a voltage or current of the battery 12 drops below a predetermined level for a predetermined period of time.

The battery monitoring system 22 also includes a self test mode 26 configured to provide feedback regarding the health of the battery monitoring system 22 and/or the battery 12 after a self test is performed. For example, the self test mode 26 may perform a self test (e.g., test the operation and/or health of the battery monitoring system 22), and provide feedback regarding the health of the battery monitoring system 22 and/or the battery 12 (e.g., that the battery voltage is above or below a predetermined level). As such, a user may verify that the battery monitoring system 22 is operating properly by initiating the self test and receiving feedback from the battery monitoring system 22 regarding the health of the battery monitoring system 22 and/or the battery 12.

The battery monitoring system 22 may provide feedback using an audio output device 28, a visual output device 30, and/or a wireless transmitter (e.g., transceiver 32). For example, the audio device 28 may include a speaker, beeper, buzzer, or any other suitable device that may provide audio feedback to a user. Furthermore, the visual output device 30 may include LEDs, an LCD, one or more lights, a screen, a display, or any other suitable device that provides visual feedback to a user. The battery monitoring system 22 may also provide feedback using a wireless transmitter. For example, the battery monitoring system 22 may transmit data relating to the health of the battery 12 using the transceiver 32. The transceiver 32 may communicate using any suitable communication protocol, such as Wi-Fi, Bluetooth, cellular, RF, and so forth. For example, the transceiver 32 may communicate with a smart phone, a tablet, a portable electronic device, a vehicle system, a Bluetooth device, a remote control, and so forth.

With the only accessible input devices 14 to the battery 12 being the positive terminal 16 and the negative terminal 18, the self test is configured to be initiated using the positive terminal 16 and the negative terminal 18, such as by varying a current or voltage applied across the terminals 16 and 18 (e.g., at predetermined intervals, at a predetermined rate, during a predetermined period of time, in a predetermined sequence, based on an adjustable setting, based on a configurable setting, based on a series of events). In certain embodiments, the self test may be initiated wirelessly by transmitting a signal to the transceiver 32.

Figure 3:
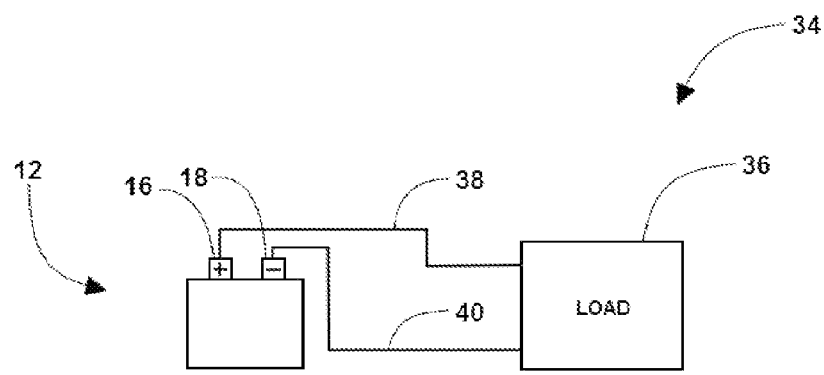
FIG. 3 is a block diagram of an embodiment of an electrical system arranged to initiate a battery self test of a battery.

FIG. 3 is a block diagram of an embodiment of an electrical system 34 arranged to initiate a self test of the battery 12 or to otherwise provide feedback from the battery monitoring system 22. The electrical system 34 includes a load 36 electrically coupled to the battery 12. Specifically, a conductor 38 couples the positive terminal 16 to the load 36, and a conductor 40 couples the negative terminal 18 to the load 36. In one embodiment, the battery self test may be initiated by varying an amount of current or voltage used by the load 36 at predetermined intervals. For example, the battery self test may be initiated by an alternating pattern of increasing the amount of current or voltage used by the load 36 and decreasing the amount of current or voltage used by the load 36 (e.g., increasing current draw, decreasing current draw, increasing current draw, etc.) over a predetermined period of time. The battery self test may also be initiated by increasing the amount of current or voltage used by the load 36 above a predetermined threshold. In the present embodiment, the load 36 may be any suitable electrical device configured to sufficiently vary the current or voltage drawn from the battery 12 to initiate the battery self test or to otherwise provide feedback from the battery monitoring system 22. For example, the load 36 may be an electrical device, a test device, an electrical system, a motor vehicle system, a vehicle system, a non-vehicular system, and so forth.

Figure 4:
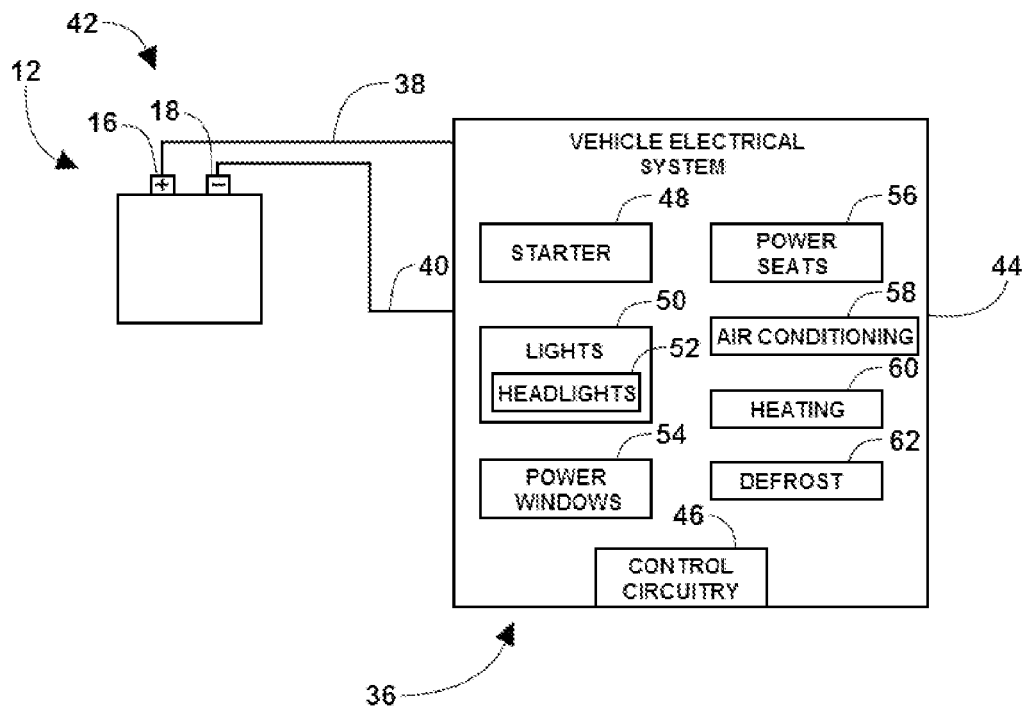
FIG. 4 is a block diagram of an embodiment of a vehicle electrical system arranged to initiate a battery self test.

FIG. 4 is a block diagram of an embodiment of a vehicle electrical system 44 arranged to initiate a self test of the battery 12 or to otherwise provide feedback from the battery monitoring system 22. The vehicle electrical system 44 includes a variety of electrical devices used to operate a motor vehicle. For example, the vehicle electrical system 44 includes control circuitry 46 which may aid in controlling, regulating, and/or monitoring electrical devices in the vehicle electrical system 44. The vehicle electrical system 44 also includes a starter 48 for starting an engine, lights 50 (e.g., headlights 52), power windows 54, power seats 56, an air conditioning system 58, a heating system 60, a defrost system 62, and so forth.

As will be appreciated, the current or voltage drawn by the vehicle electrical system 44 may be varied to initiate the battery self test or to provide feedback from the battery monitoring system 22. For example, the battery self test may be initiated by alternating between activating the starter 48 and deactivating the starter 48 a series of times. As another example, the battery self test may be initiated by alternating between activating and deactivating the lights 50, flashing headlights 52, adjusting power windows 54, adjusting power seats 56, adjusting the air conditioning system, adjusting the heating system 60, adjusting the defrost system 62, or adjusting any other portion of the vehicle electrical system 44. As will be appreciated, the current draw or voltage used by the vehicle electrical system 44 may be varied manually by a user activating and/or deactivating an electrical component, and/or the vehicle electrical system 44 may be varied automatically by the control circuitry 46 when a command is sent to the control circuitry 46. For example, the control circuitry 46 may be configured to cause an alternating increase and/or decrease of current or voltage drawn by the vehicle electrical system 44. In certain embodiments, the control circuitry 46 may turn on and/or off one or more devices of the vehicle electrical system 44 to initiate the battery self test or to otherwise provide feedback from the battery monitoring system 22. Accordingly, the self test may be initiated by varying the current draw or voltage of the load 36 coupled to the battery 12.

Figure 5:
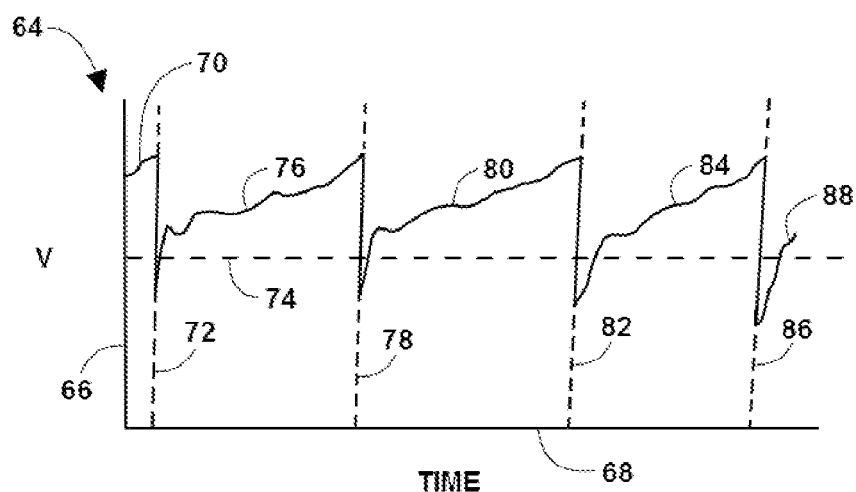
FIG. 5 is a graph of an embodiment of a battery voltage pattern that may be used to initiate a battery self test.

FIG. 5 is a graph 64 of an embodiment of a battery voltage 66 (e.g., or current) that may be used to initiate a self test of the battery 12. The graph 64 illustrates how the voltage 66 changes over time 68 based on the current draw of the load 36 coupled to the battery 12. For example, the battery voltage 66 increases during segment 70 until time 72 when the battery voltage 66 spikes downward. At the time 72, the battery voltage 66 passes a minimum voltage threshold 74 that is used by the battery monitoring system 22 to determine when to initiate the self test. During segment 76, the battery voltage 66 generally increases above the minimum voltage threshold 74 until time 78 when the battery voltage 66 again spikes downward. Furthermore, at the time 78, the battery voltage 66 again passes the minimum voltage threshold 74. The same alternating pattern of battery voltage 66 continues with the battery voltage 66 generally increasing above the minimum voltage threshold 74 during segments 80, 84, and 88, and the battery voltage 66 spiking downward below the minimum voltage threshold 74 at times 82 and 86.

The battery voltage 66 may spike downward below the minimum voltage threshold 74 (e.g., at times 72, 78, 82, and 86) when the current draw of the load 36 increases (e.g., when one or more electrical devices are turned on and/or off). Furthermore, as illustrated, the battery voltage 66 increases above the minimum voltage threshold 74 during segments 76, 80, 84, and 88. As will be appreciated, the battery monitoring system 22 may be configured to detect when the battery voltage 66 decreases below and/or increases above the minimum voltage threshold 74. Furthermore, the battery monitoring system 22 may be configured to detect a predetermined frequency or a predetermined interval (e.g., multiple occurrences) of the battery voltage 66 passing the minimum voltage threshold 74. Accordingly, the battery monitoring system 22 may be configured to initiate the self test if the battery voltage 66 passes the minimum voltage threshold 74 a predetermined number of times (e.g., 1, 2, 3, 4, 6, 8, etc.) within a predetermined time period (e.g., less than 1 second, 1 second, 2 seconds, 5 seconds, 20 seconds, 40 seconds, 60 seconds, or greater than 60 seconds). In some embodiments, the battery monitoring system 22 may be configured to detect any pattern of change in the battery voltage 66 and initiate the self test when the pattern of change is detected. In the present embodiment, the battery self test may be initiated using the positive terminal 16 and the negative terminal 18 as inputs to the battery 12 when a load attached to the battery 12 causes a predetermined change in the battery voltage 66.

Figure 6:
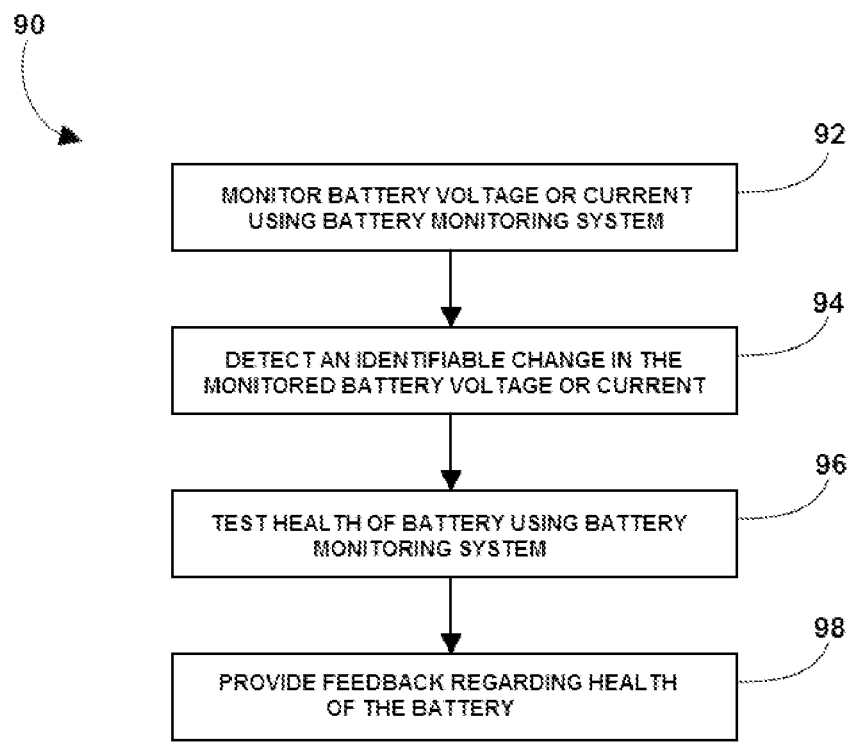
FIG. 6 is a flow chart of an embodiment of a method of performing a battery self test.

FIG. 6 is a flow chart of an embodiment of a method 90 of performing a battery self test or to otherwise provide feedback from the battery monitoring system 22. At block 92, the battery monitoring system 22 disposed within the battery 12 monitors the battery voltage 66 or current. Then, at block 94, the battery monitoring system 22 detects an identifiable (e.g., predetermined) change in the monitored battery voltage 66 or current. For example, the battery monitoring system 22 may detect when the monitored battery voltage 66 or current drops below a predetermined threshold (e.g., minimum voltage threshold 74). Furthermore, the battery monitoring system 22 may detect a frequency (e.g., number of times over a time period) when the monitored battery voltage 66 or current drops below the predetermined threshold.

Next, at block 96, the battery monitoring system 22 may perform a self test and/or may otherwise determine or provide a health of the battery 12 after the identifiable change has been detected. For example, the battery monitoring system 22 may determine that the health of the battery 12 is good (e.g., the battery properly holds a charge, the battery voltage is within a predetermined range, the battery can provide current within a predetermined range) or bad (e.g., the battery needs to be replaced, the battery does not properly hold a charge, the battery voltage is outside of a predetermined range, the battery cannot provide current within a predetermined range). As another example, the battery monitoring system 22 may determine that the health of the battery monitoring system 22 is good (e.g., the battery monitoring system is monitoring the battery properly) or bad (e.g., the battery monitoring system is not monitoring the battery properly). At block 98, the battery monitoring system 22 provides feedback regarding (e.g., indicative of) the health of the battery 12 and/or the battery monitoring system 22. For example, the battery monitoring system 22 may provide feedback using an audio, a visual, and/or a wireless device. In certain embodiments, a number of audible beeps may give feedback regarding the health of the battery 12 (e.g., one beep—normal operation, two beeps—degraded operation, three beeps—battery needs replacing and so forth). Furthermore, a number of audible beeps may give feedback regarding the health of the battery monitoring system 22 (e.g., four beeps—normal operation, five beeps—not operating properly, and so forth). In some embodiments, a first audio sequence may indicate that the battery health is good, a second audio sequence may indicate that the battery health is bad, a third audio sequence may indicate that the battery monitoring system health is good, and a fourth audio sequence may indicate that the battery monitoring system health is bad. Accordingly, a self test of the battery monitoring system 22 or feedback request may be initiated without switches or buttons disposed on the housing 20 of the battery 12.

While only certain features and embodiments of the invention have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the exemplary embodiments, all features of an actual implementation may not have been described (i.e., those unrelated to the presently contemplated best mode of carrying out the invention, or those unrelated to enabling the claimed invention). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A battery comprising:
   a battery monitoring system integrated into the battery and configured to monitor a first health of the battery;
   wherein the battery monitoring system is configured to receive an input signal from a wired interface or a wireless interface, the input signal is configured to instruct the battery monitoring system to provide feedback regarding the first health of the battery and a second health of the battery monitoring system, and the wired interface consists of a positive terminal and a negative terminal of the battery.

2. The battery of claim 1, wherein the battery monitoring system is configured to provide feedback after a current draw or a voltage of a load electrically coupled to the battery is varied.

3. The battery of claim 2, wherein the current draw or the voltage of the load electrically coupled to the battery is configured to be varied by adjusting the input signal a predetermined number of times, at predetermined intervals, at a predetermined rate, based on an adjustable setting, or any combination thereof.

4. The battery of claim 1, wherein the battery monitoring system is configured to provide feedback after a current draw or a voltage of a vehicle electrical system electrically coupled to the battery is varied.

5. The battery of claim 4, wherein the current draw or the voltage of the vehicle electrical system is configured to be varied by activating a starter of the vehicle electrical system.

6. The battery of claim 4, wherein the current draw or the voltage of the vehicle electrical system is configured to be varied by flashing headlights of the vehicle electrical system, adjusting power windows of the vehicle electrical system, adjusting power seats of the vehicle electrical system, adjusting air conditioning of the vehicle electrical system, adjusting a front and/or a rear defroster of the vehicle electrical system, or any combination thereof.

7. The battery of claim 4, wherein the current draw or the voltage of the vehicle electrical system is configured to be varied by adjusting the input signal a predetermined number of times, at predetermined intervals, at a predetermined rate, based on an adjustable setting, or any combination thereof.

8. The battery of claim 1, wherein the battery monitoring system is configured to provide feedback after a current draw or a voltage of a non-vehicular load electrically coupled to the battery is varied.

9. The battery of claim 1, wherein the battery monitoring system is configured to provide feedback after the battery receives a wireless signal.

10. The battery of claim 1, comprising a wireless device configured to provide wireless feedback indicative of the first health of the battery and the second health of the battery monitoring system.

11. The battery of claim 1, comprising an optical device configured to provide visual feedback indicative of the first health of the battery and the second health of the battery monitoring system.

12. The battery of claim 1, comprising an audio device configured to provide audio feedback indicative of the first health of the battery and the second health of the battery monitoring system.

13. A method for performing a self test of a battery comprising:
    monitoring a battery voltage or current using a battery monitoring system disposed within the battery;
    detecting a predetermined change in the monitored battery voltage or current, wherein the predetermined change is detected by the battery monitoring system; and
    providing feedback indicative of a first health of the battery and a second health of the battery monitoring system upon detecting the predetermined change.

14. The method of claim 13, wherein providing feedback indicative of the first health of the battery and the second health of the battery monitoring system comprises providing audio feedback indicative of the first health of the battery and the second health of the battery monitoring system.

15. The method of claim 14, wherein providing audio feedback indicative of the first health of the battery and the second health of the battery monitoring system comprises providing a first audio sequence indicating that the first health of the battery or the second health of the battery monitoring system is good and providing a second audio sequence indicating that the first health of the battery or the second health of the battery monitoring system is bad.

16. The method of claim 13, wherein providing feedback indicative of the first health of the battery and the second health of the battery monitoring system comprises providing visual feedback indicative of the first health of the battery and the second health of the battery monitoring system.

17. A motor vehicle comprising:
    a battery having an integrated battery monitoring system configured to monitor a first health of the battery, wherein the battery monitoring system is configured to receive an input signal from a wired interface or a wireless interface, the input signal is configured to instruct the battery monitoring system to provide feedback regarding the first health of the battery and a second health of the battery monitoring system, and the wired interface consists of a positive terminal and a negative terminal of the battery; and
    an electrical system electrically coupled to the positive terminal and the negative terminal of the battery and configured to draw current from the battery.

18. The motor vehicle of claim 17, wherein the battery monitoring system is configured to provide feedback after an amount of electrical current or voltage that the electrical system draws from the battery is varied.

19. The motor vehicle of claim 17, wherein the battery monitoring system is configured to provide feedback after a set of predetermined steps are performed to vary an amount of electrical current or voltage that the electrical system draws from the battery.

20. The motor vehicle of claim 19, wherein the set of predetermined steps comprise activating electrical devices, deactivating electrical devices, adjusting electrical devices, or any combination thereof.

* * * * *